United States Patent
Yamato et al.

(10) Patent No.: US 12,119,813 B2
(45) Date of Patent: Oct. 15, 2024

(54) SWITCH DEVICE, ELECTRONIC EQUIPMENT, AND VEHICLE

(71) Applicant: ROHM Co., LTD., Kyoto (JP)

(72) Inventors: Tetsuo Yamato, Kyoto (JP); Shuntaro Takahashi, Kyoto (JP); Kazuki Okuyama, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 73 days.

(21) Appl. No.: 18/047,441

(22) Filed: Oct. 18, 2022

(65) Prior Publication Data
US 2023/0125777 A1  Apr. 27, 2023

(30) Foreign Application Priority Data

Oct. 21, 2021 (JP) ................................ 2021-172157

(51) Int. Cl.
| | |
|---|---|
| H03K 17/687 | (2006.01) |
| H01H 47/00 | (2006.01) |
| H01H 47/04 | (2006.01) |
| H01H 47/32 | (2006.01) |

(52) U.S. Cl.
CPC ... *H03K 17/687* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | | |
|---|---|---|---|---|
| 4,209,713 A | * | 6/1980 | Satou | H03K 17/162 |
| | | | | 257/376 |
| 5,179,298 A | * | 1/1993 | Hirano | H03K 17/162 |
| | | | | 326/27 |
| 5,583,457 A | * | 12/1996 | Horiguchi | H03K 3/356113 |
| | | | | 327/544 |
| 5,614,847 A | * | 3/1997 | Kawahara | H03K 3/356113 |
| | | | | 326/98 |
| 6,049,245 A | * | 4/2000 | Son | G11C 5/147 |
| | | | | 327/544 |
| 6,552,596 B2 | * | 4/2003 | Cowles | H03K 19/0016 |
| | | | | 327/318 |
| 7,369,391 B2 | * | 5/2008 | Tanaka | H01H 47/04 |
| | | | | 361/160 |

FOREIGN PATENT DOCUMENTS

JP  2020096316  6/2020

\* cited by examiner

*Primary Examiner* — Kenneth B Wells
(74) *Attorney, Agent, or Firm* — CHIP LAW GROUP

(57) ABSTRACT

Disclosed is a switch device including a first terminal, a second terminal, a third terminal, a switch element disposed between the first terminal and the second terminal, a control line that reaches a control end of the switch element from the third terminal, a first circuit block that is disposed on the control line and is configured to drive the switch element according to a control signal supplied to the third terminal, at least one second circuit block, each second circuit block being connected to a corresponding one of branch power supply lines that branch from the control line, a first resistor disposed between the third terminal and the first circuit block, and at least one second resistor, each second resistor being disposed on a corresponding one of the branch power supply lines.

12 Claims, 4 Drawing Sheets

SWITCH DEVICE, ELECTRONIC EQUIPMENT, AND VEHICLE

CROSS REFERENCE TO RELATED APPLICATIONS

This application claims priority benefit of Japanese Patent Application No. JP 2021-172157 filed in the Japan Patent Office on Oct. 21, 2021. Each of the above-referenced applications is hereby incorporated herein by reference in its entirety.

BACKGROUND

The disclosure described in the present specification relates to a switch device, electronic equipment, and a vehicle.

A switch device such as an in-vehicle intelligent power device (IPD) is connected to an inductive load, for example (for example, refer to Japanese Patent Laid-open No. 2020-96316 (paragraph 0019)).

FIG. 1 is a diagram illustrating an example of connection among a solenoid that is one kind of inductive load, a low-side switch integrated circuit (IC) for in-vehicle use that is one kind of switch device, and a direct-current power supply. A low-side switch IC 1 for in-vehicle use includes an input terminal IN, a ground terminal GND, and an output terminal OUT.

The input terminal IN is connected to a positive electrode of a direct-current power supply 2. The ground terminal GND and a negative electrode of the direct-current power supply 2 are connected to a ground potential. The output terminal OUT is connected to a first end of a solenoid 3. A second end of the solenoid 3 is connected to an application end to which an output voltage Vbat of a battery mounted in a vehicle is applied.

In the case in which the low-side switch IC 1 for in-vehicle use has a configuration including a P-channel metal oxide semiconductor field effect transistor (MOSFET), there is a fear that a latch-up occurs when the solenoid 3 is disconnected, more specifically, when the electrical connection between the solenoid 3 and the application end to which the output voltage Vbat of the battery is applied is interrupted.

SUMMARY

Here, the occurrence mechanism of the above-described latch-up will be described with reference to a sectional view of a P-channel MOSFET illustrated in FIG. 2.

The P-channel MOSFET illustrated in FIG. 2 is incorporated in the low-side switch IC 1 for in-vehicle use. The P-channel MOSFET is formed on an N-type semiconductor substrate 10. A drain electrode 11 is formed on a back surface of the N-type semiconductor substrate 10, and an N-type epitaxially grown layer 12 is formed on a front surface of the N-type semiconductor substrate 10.

Further, a P-type well 13 is formed in the N-type epitaxially grown layer 12. In addition, an N-type region 14 is formed in the P-type well 13. Moreover, a heavily-doped P-type region 15 that serves as a gate, a heavily-doped P-type region 16 that serves as a source, and a heavily-doped N-type region 17 that serves as a back gate are formed in the N-type region 14.

A parasitic diode D1 is formed by the P-type well 13 and the N-type epitaxially grown layer 12. A parasitic NPN transistor Tr1 is formed by the N-type region 14, the P-type well 13, and the N-type epitaxially grown layer 12. A parasitic PNP transistor Tr2 is formed by the heavily-doped P-type region 16, the N-type region 14, and the P-type well 13.

When the solenoid 3 is disconnected, the potential of the drain electrode 11 swings to the negative side. Due to this, the parasitic diode D1 is turned on. When the parasitic diode D1 is turned on, the parasitic NPN transistor Tr1 is turned on, and a collector current I1 of the parasitic NPN transistor Tr1 flows.

When the base-emitter voltage of the parasitic PNP transistor Tr2 becomes equal to or higher than the forward voltage due to the flow of the collector current I1, the parasitic PNP transistor Tr2 is turned on, and an emitter current I2 of the parasitic PNP transistor Tr2 flows.

When the parasitic NPN transistor Tr1 is turned on and the collector current I1 flows, a current flows also to the base of the parasitic PNP transistor Tr2. Further, when the parasitic PNP transistor Tr2 is turned on and the emitter current I2 flows, a current flows also to the base of the parasitic NPN transistor Tr1. That is, the parasitic NPN transistor Tr1 and the parasitic PNP transistor Tr2 configure a thyristor in which the current continues to flow, and a latch-up occurs due to the thyristor.

Therefore, by disposing a resistor 4 for current limitation between the direct-current power supply 2 and the input terminal IN as illustrated in FIG. 3, the above-described parasitic thyristor is eliminated, and the occurrence of the latch-up can be prevented.

However, the voltage applied to the input terminal IN drops due to the disposing of the resistor 4. Therefore, a problem that the low-side switch IC 1 for in-vehicle use is not driven at the time of voltage reduction (at the time of lowering of the output voltage of the direct-current power supply 2) occurs.

A switch device disclosed in the present specification includes a first terminal, a second terminal, a third terminal, a switch element disposed between the first terminal and the second terminal, a control line that reaches a control end of the switch element from the third terminal, a first circuit block that is disposed on the control line and is configured to drive the switch element according to a control signal supplied to the third terminal, at least one second circuit block, each second circuit block being connected to a corresponding one of branch power supply lines that branch from the control line, a first resistor disposed between the third terminal and the first circuit block, and at least one second resistor, each second resistor being disposed on a corresponding one of the branch power supply lines. The first circuit block and the at least one second circuit block each include at least one P-channel MOSFET. The branch power supply lines branch from the control line between the third terminal and the first resistor.

Electronic equipment disclosed in the present specification includes the switch device with the above-described configuration and an inductive load connected to the switch device.

A vehicle disclosed in the present specification includes the electronic equipment with the above-described configuration.

According to the switch device, the electronic equipment, and the vehicle disclosed in the present specification, the occurrence of a latch-up when the inductive load is disconnected can be suppressed while driving at the time of voltage reduction is ensured.

DETAILED DESCRIPTION OF THE PREFERRED EMBODIMENT

In the present specification, the MOSFET means a field effect transistor having a gate structure including at least three layers of "a layer including an electrical conductor or such a semiconductor as polysilicon with a small resistance value," "an insulating layer," and "a P-type, N-type, or intrinsic semiconductor layer." That is, the gate structure of the MOSFET is not limited to a three-layer structure of a metal, an oxide, and a semiconductor.

Figure 4:
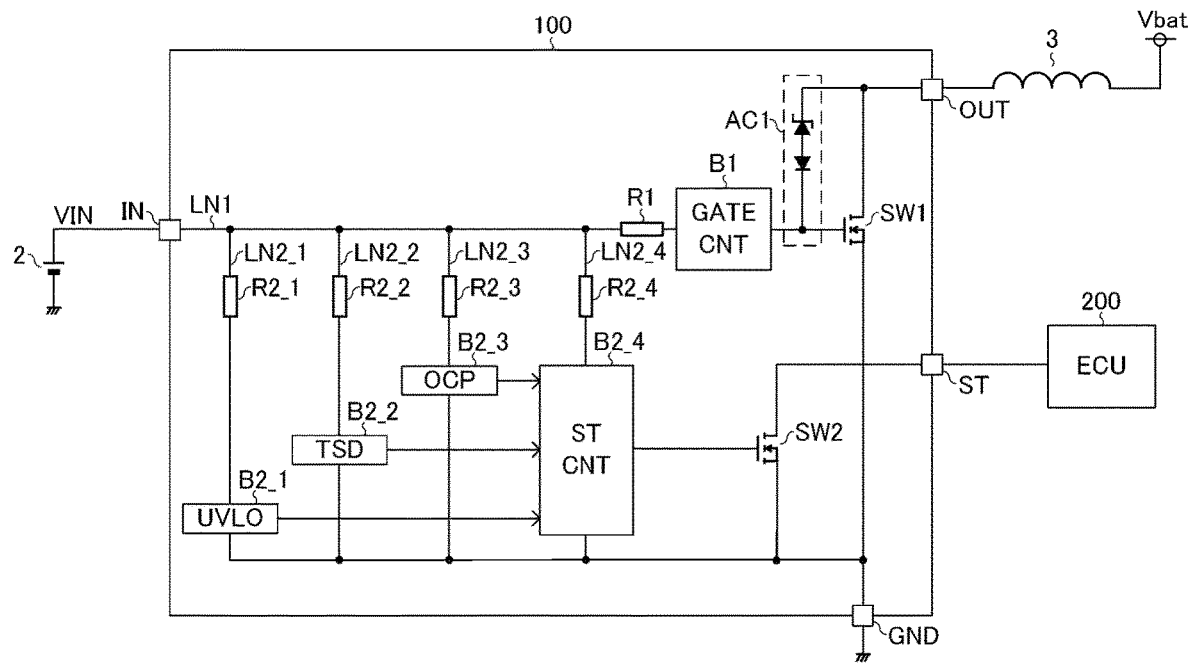
FIG. 4 is a diagram illustrating the configuration of a switch device according to an embodiment.

FIG. 4 is a diagram illustrating the configuration of a switch device 100 according to an embodiment (hereinafter, simply referred to as the switch device 100).

The switch device 100 is a low-side switch IC for in-vehicle use. The switch device 100 includes an input terminal IN, an output terminal OUT, a ground terminal GND, and a status terminal ST.

The input terminal IN is connected to a positive electrode of a direct-current power supply 2 as illustrated in FIG. 4, for example. The ground terminal GND and a negative electrode of the direct-current power supply 2 are connected to a ground potential as illustrated in FIG. 4, for example. The output terminal OUT is connected to a first end of a solenoid 3 as illustrated in FIG. 4, for example. A second end of the solenoid 3 is connected to an application end to which an output voltage Vbat of a battery mounted in a vehicle is applied. The status terminal ST is connected to an electronic control unit (ECU) 200 as illustrated in FIG. 4, for example.

The switch device 100 includes switch elements SW1 and SW2, an active clamp AC1, a gate control circuit block B1, a reduced voltage protective circuit block B2_1, a temperature protective circuit block B2_2, an overcurrent protective circuit block B2_3, a status signal control circuit block B2_4, resistors R1 and R2_1 to R2_4, a control line LN1, and branch power supply lines LN2_1 to LN2_4.

The switch elements SW1 and SW2 are each an N-channel MOSFET. The drain of the switch element SW1 is connected to the output terminal OUT. The drain of the switch element SW2 is connected to the status terminal ST. The respective sources of the switch elements SW1 and SW2 are connected to the ground terminal GND. As the switch element SW1, for example, an N-channel MOSFET with a structure in which a current flows in the thickness direction of a semiconductor substrate (vertical direction) between the source and the drain, i.e., a vertical structure, can be used. Further, as the switch element SW1, for example, a double-diffused MOSFET (DMOSFET) can be used. As the switch element SW2, for example, an N-channel MOSFET with a structure in which a current flows in the direction parallel to a front surface of the semiconductor substrate (lateral direction) between the source and the drain, i.e., a lateral structure, can be used. Moreover, as the switch element SW2, for example, an N-channel MOSFET fabricated by a complementary MOS (CMOS) process can be used.

There is a fear that the voltage applied to the output terminal OUT becomes a negative voltage (<ground potential) due to breakdown or noise. Thus, the active clamp AC1 is disposed for energy absorption. The active clamp AC1 is disposed between the gate and the drain of the switch element SW1. The active clamp AC1 includes a Zener diode and a diode. The cathode of the Zener diode is connected to the drain of the switch element SW1. The anode of the Zener diode is connected to the anode of the diode. The cathode of the diode is connected to the gate of the switch element SW1.

The control line LN1 is a line that couples the input terminal IN and the gate of the switch element SW1.

The gate control circuit block B1 is disposed on the control line LN1 and is configured to drive the switch element SW1 according to a control signal supplied to the input terminal IN.

When an input voltage VIN is supplied from the direct-current power supply 2 to the input terminal IN, i.e., when the control signal supplied to the input terminal IN is at a high level, the gate control circuit block B1 is in an operating state, and a gate control signal supplied from the gate control circuit block B1 to the gate of the switch element SW1 is at a high level. As a result, the switch element SW1 is in the on-state.

On the other hand, when the input voltage VIN is not supplied from the direct-current power supply 2 to the input terminal IN, i.e., when the control signal supplied to the input terminal IN is at a low level, the gate control circuit block B1 is in a non-operating state, and the gate control signal supplied from the gate control circuit block B1 to the gate of the switch element SW1 is at a low level. As a result, the switch element SW1 is in the off-state.

The reduced voltage protective circuit block B2_1 is connected to the branch power supply line LN2_1 that branches from the control line LN1. The reduced voltage protective circuit block B2_1 monitors whether or not a reduced voltage abnormality is caused in the input voltage VIN, and transmits the monitoring result thereof to the status signal control circuit block B2_4. When the input voltage VIN is supplied from the direct-current power supply 2 to the input terminal IN, the reduced voltage protective circuit block B2_1 is in an operating state. On the other hand, when the input voltage VIN is not supplied from the direct-current power supply 2 to the input terminal IN, the reduced voltage protective circuit block B2_1 is in a non-operating state.

The temperature protective circuit block B2_2 is connected to the branch power supply line LN2_2 that branches from the control line LN1. The temperature protective circuit block B2_2 includes a temperature sensor that detects abnormal heat generation of the switch device 100, monitors whether or not abnormal heat generation of the switch device 100 is caused, and transmits the monitoring result thereof to the status signal control circuit block B2_4. When the input voltage VIN is supplied from the direct-current power supply 2 to the input terminal IN, the temperature protective circuit block B2_2 is in an operating state. On the other hand, when the input voltage VIN is not supplied from the direct-current power supply 2 to the input terminal IN, the temperature protective circuit block B2_2 is in a non-operating state.

The overcurrent protective circuit block B2_3 is connected to the branch power supply line LN2_3 that branches from the control line LN1. The overcurrent protective circuit block B2_3 monitors whether or not an overcurrent abnormality of the current that flows through the output terminal OUT is caused, and transmits the monitoring result thereof to the status signal control circuit block B2_4. When the input voltage VIN is supplied from the direct-current power supply 2 to the input terminal IN, the overcurrent protective circuit block B2_3 is in an operating state. On the other hand, when the input voltage VIN is not supplied from the direct-current power supply 2 to the input terminal IN, the overcurrent protective circuit block B2_3 is in a non-operating state.

The status signal control circuit block B2_4 is connected to the branch power supply line LN2_4 that branches from the control line LN1.

When at least one of the reduced voltage protective circuit block B2_1, the temperature protective circuit block B2_2, and the overcurrent protective circuit block B2_3 detects an abnormality, the status signal control circuit block B2_4, for example, outputs a gate control signal at a high level to the gate of the switch element SW2 to set a status signal, which is to be output from the status terminal ST, to a low level.

On the other hand, when none of the reduced voltage protective circuit block B2_1, the temperature protective circuit block B2_2, and the overcurrent protective circuit block B2_3 detects an abnormality, the status signal control circuit block B2_4, for example, outputs the gate control signal at a low level to the gate of the switch element SW2 to set the status signal, which is to be output from the status terminal ST, to a high level. A pull-up resistor is connected to the status terminal ST.

The respective ground application ends of the reduced voltage protective circuit block B2_1, the temperature protective circuit block B2_2, the overcurrent protective circuit block B2_3, and the status signal control circuit block B2_4 are connected to the ground terminal GND.

The resistor R1 is disposed between the input terminal IN and the gate control circuit block B1. The resistor R2_1 is disposed on the branch power supply line LN2_1. The resistor R2_2 is disposed on the branch power supply line LN2_2. The resistor R2_3 is disposed on the branch power supply line LN2_3. The resistor R2_4 is disposed on the branch power supply line LN2_4.

The branch power supply lines LN2_1 to LN2_4 branch from the control line LN1 between the input terminal IN and the resistor R1.

Figure 1:
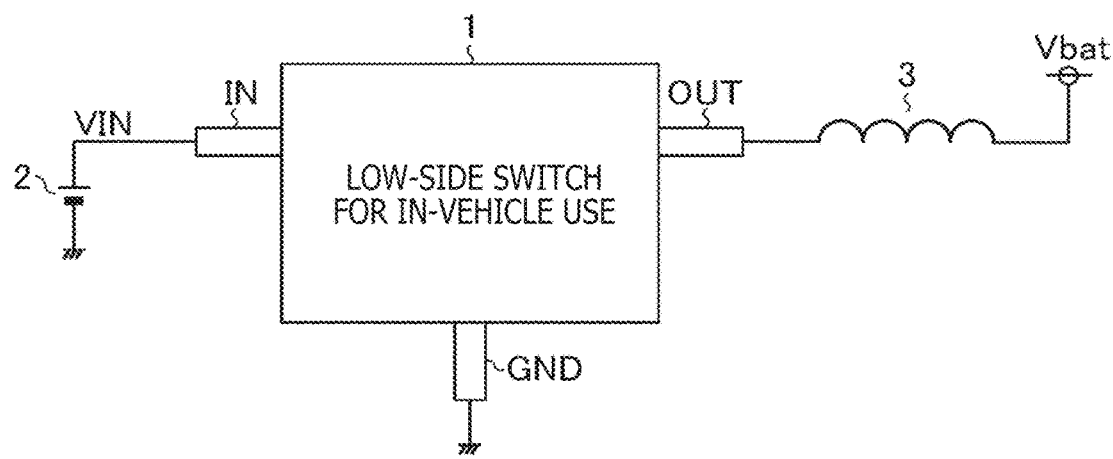
FIG. 1 is a diagram illustrating an example of connection among a solenoid, a low-side switch IC, and a direct-current power supply.
Figure 2:
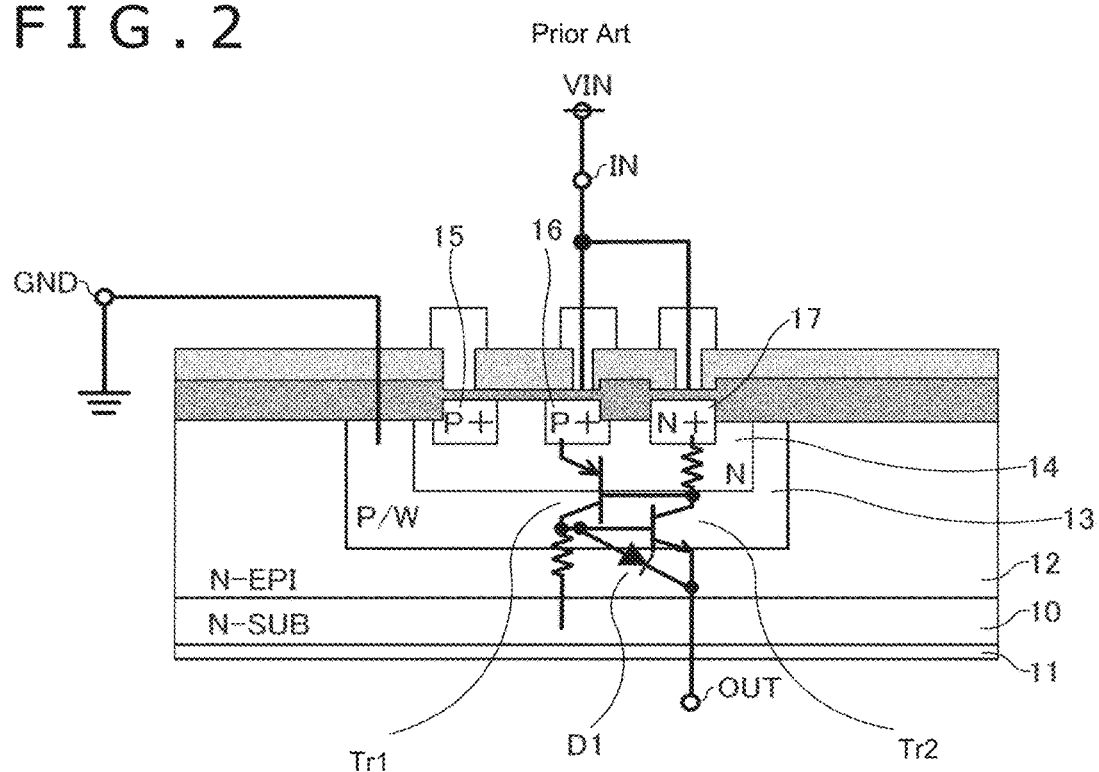
FIG. 2 is a sectional view of a P-channel MOSFET.
Figure 3:
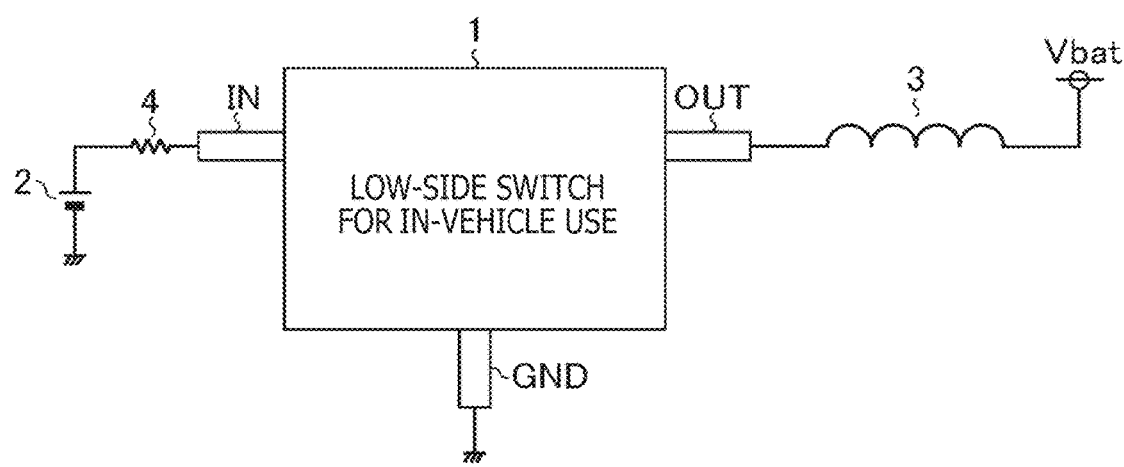
FIG. 3 is a diagram illustrating an example of connection for which a measure against a latch-up is made among the solenoid, the low-side switch IC, and the direct-current power supply.

Each of the gate control circuit block B1, the reduced voltage protective circuit block B2_1, the temperature protective circuit block B2_2, the overcurrent protective circuit block B2_3, and the status signal control circuit block B2_4 includes at least one P-channel MOSFET. As the P-channel MOSFET, for example, a P-channel MOSFET with a structure in which a current flows in the direction parallel to the front surface of the semiconductor substrate (lateral direction) between the source and the drain, i.e., a lateral structure, can be used. Further, as the P-channel MOSFET, for example, a P-channel MOSFET fabricated by a CMOS process can be used. Each of the sources of the P-channel MOSFETs is indirectly connected to the terminal IN. Each of the drains of the P-channel MOSFETs is directly or indirectly connected to the terminal OUT. Each of the P-type wells (see FIG. 2) of the P-channel MOSFETs is connected to the terminal GND.

The switch device 100 with the above-described configuration includes the resistors R1 and R2_1 to R2_4 that limit the respective currents flowing to the gate control circuit block B1, the reduced voltage protective circuit block B2_1, the temperature protective circuit block B2_2, the overcurrent protective circuit block B2_3, and the status signal control circuit block B2_4. Therefore, by properly setting each of the resistance values of the resistors R1 and R2_1 to R2_4, the occurrence of a latch-up when the solenoid 3 is disconnected can be suppressed while driving at the time of voltage reduction is ensured in each of the gate control circuit block B1, the reduced voltage protective circuit block B2_1, the temperature protective circuit block B2_2, the overcurrent protective circuit block B2_3, and the status signal control circuit block B2_4. As a result, also in the whole of the switch device 100, the occurrence of a latch-up when the solenoid 3 is disconnected can be suppressed while driving at the time of voltage reduction is ensured.

Figure 5:
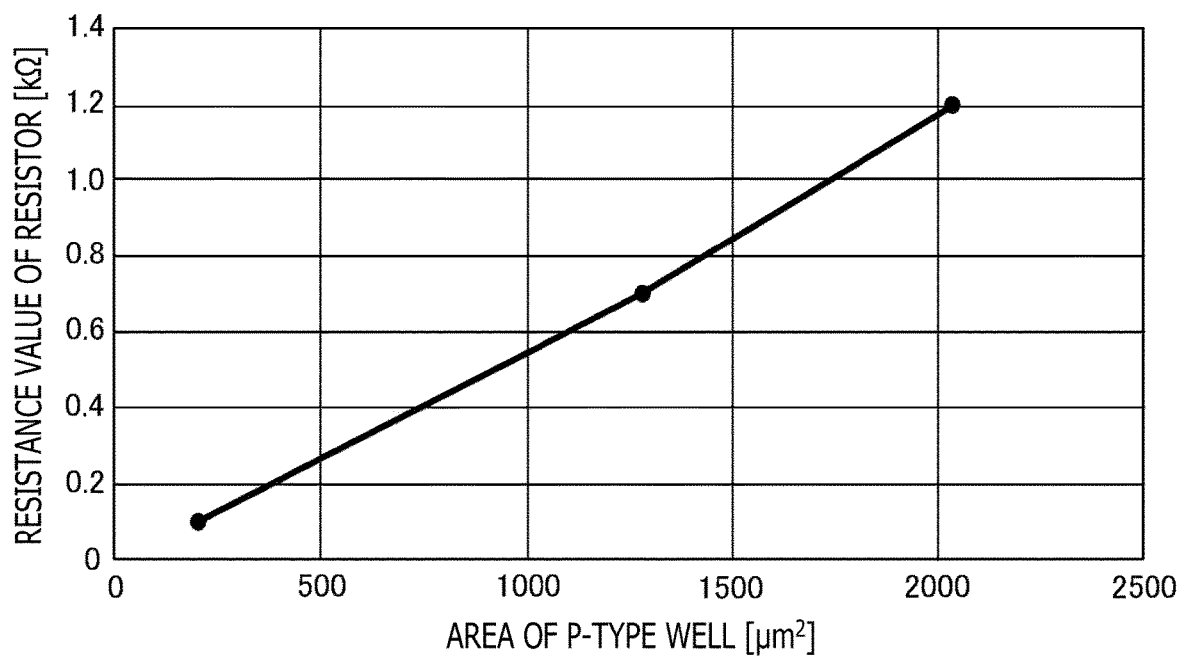
FIG. 5 is a diagram illustrating one example of the relation between the area of a P-type well and the resistance value of a resistor.

FIG. 5 is a diagram illustrating one example of the relation between the area of the P-type well and the resistance value of the resistor. The relation between the area of the P-type well and the resistance value of the resistor (minimum resistance value with which the occurrence of a latch-up can be prevented) changes depending on the process. The area of the P-type well means the total area of the P-type well that is disposed in the P-channel MOSFET of each of the gate control circuit block B1, the reduced voltage protective circuit block B2_1, the temperature protective circuit block B2_2, the overcurrent protective circuit block B2_3, and the status signal control circuit block B2_4. The area of the P-type well means the area as viewed from the thickness direction of the N-type semiconductor substrate 10 (see FIG. 2).

The resistance value in the graph illustrated in FIG. 5 is the minimum resistance value with which the occurrence of a latch-up can be prevented. For example, in the case in which the total area of the P-type well that is disposed in the P-channel MOSFET of the gate control circuit block B1 is 2000 μm$^2$, a latch-up of the gate control circuit block B1 can be prevented when the resistance value of the resistor R1 is equal to or larger than 1.18 kΩ.

Therefore, it is desirable that each of the resistance values of the resistors R1 and R2_1 to R2_4 be a resistance value based on the total area of the P-type well that is disposed in the P-channel MOSFET of a corresponding one of the gate control circuit block B1, the reduced voltage protective circuit block B2_1, the temperature protective circuit block B2_2, the overcurrent protective circuit block B2_3, and the status signal control circuit block B2_4. More specifically, it is desirable that the resistance value be larger as the total area of the P-type well that is disposed in the P-channel MOSFET is larger. This can prevent each of the resistance values of the resistors R1 and R2_1 to R2_4 from becoming unnecessarily large.

When the current consumption in the circuit block is low, driving at the time of voltage reduction can be ensured even when the above-described resistance value is set large. Therefore, as long as the above-described resistance value is set in consideration of the current consumption in the circuit block, the resistance value does not need to be set according to the total area of the P-type well that is disposed in the P-channel MOSFET. For example, the respective resistance values of the resistors R1 and R2_1 to R2_4 may be the same value as long as driving at the time of voltage reduction can be ensured in each of the gate control circuit block B1, the reduced voltage protective circuit block B2_1, the temperature protective circuit block B2_2, the overcurrent protective circuit block B2_3, and the status signal control circuit block B2_4.

Figure 6:
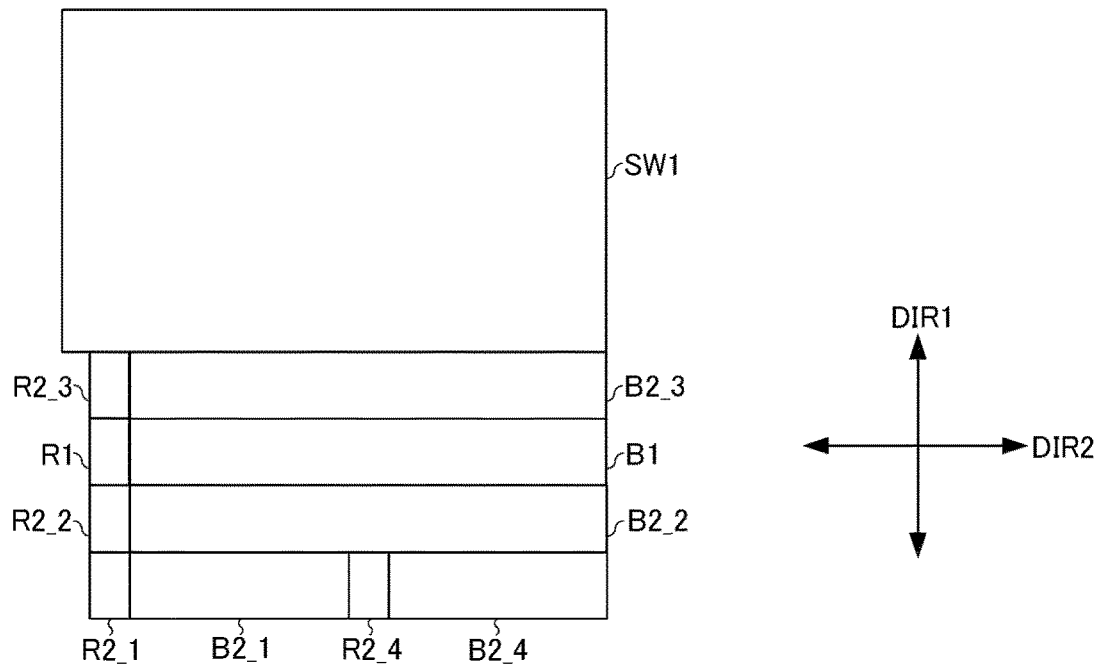
FIG. 6 is a diagram illustrating a schematic layout example of the switch device according to the embodiment.

FIG. 6 is a diagram illustrating a schematic layout example of the switch device 100. FIG. 6 illustrates the layout as viewed from the thickness direction of the N-type semiconductor substrate 10 (see FIG. 2).

The switch element SW1 is a power element and thus has a larger area than each of the gate control circuit block B1, the reduced voltage protective circuit block B2_1, the temperature protective circuit block B2_2, the overcurrent protective circuit block B2_3, and the status signal control circuit block B2_4.

The gate control circuit block B1 is disposed adjacent to the resistor R1. That is, another circuit element is not disposed between the gate control circuit block B1 and the resistor R1. Such an arrangement can suppress routing of the control line LN1.

The reduced voltage protective circuit block B2_1 is disposed adjacent to the resistor R2_1. That is, another circuit element is not disposed between the reduced voltage protective circuit block B2_1 and the resistor R2_1. Such an arrangement can suppress routing of the branch power supply line LN2_1.

The temperature protective circuit block B2_2 is disposed adjacent to the resistor R2_2. That is, another circuit element is not disposed between the temperature protective circuit block B2_2 and the resistor R2_2. Such an arrangement can suppress routing of the branch power supply line LN2_2.

The overcurrent protective circuit block B2_3 is disposed adjacent to the resistor R2_3. That is, another circuit element is not disposed between the overcurrent protective circuit block B2_3 and the resistor R2_3. Such an arrangement can suppress routing of the branch power supply line LN2_3.

The status signal control circuit block B2_4 is disposed adjacent to the resistor R2_4. That is, another circuit element is not disposed between the status signal control circuit block B2_4 and the resistor R2_4. Such an arrangement can suppress routing of the branch power supply line LN2_4.

The gate control circuit block B1, the reduced voltage protective circuit block B2_1, the temperature protective circuit block B2_2, the overcurrent protective circuit block B2_3, the status signal control circuit block B2_4, and the switch element SW1 line up along a first direction DIR1. The gate control circuit block B1 and the resistor R1 line up along a second direction DIR2 orthogonal to the first direction DIR1. The reduced voltage protective circuit block B2_1 and the resistor R2_1 line up along the second direction DIR2. The temperature protective circuit block B2_2 and the resistor R2_2 line up along the second direction DIR2. The overcurrent protective circuit block B2_3 and the resistor R2_3 line up along the second direction DIR2. The status signal control circuit block B2_4 and the resistor R2_4 line up along the second direction DIR2. Such an arrangement can suppress the occurrence of the situation in which the switch device 100 becomes excessively long in only either the first direction DIR1 or the second direction DIR2.

Figure 7:
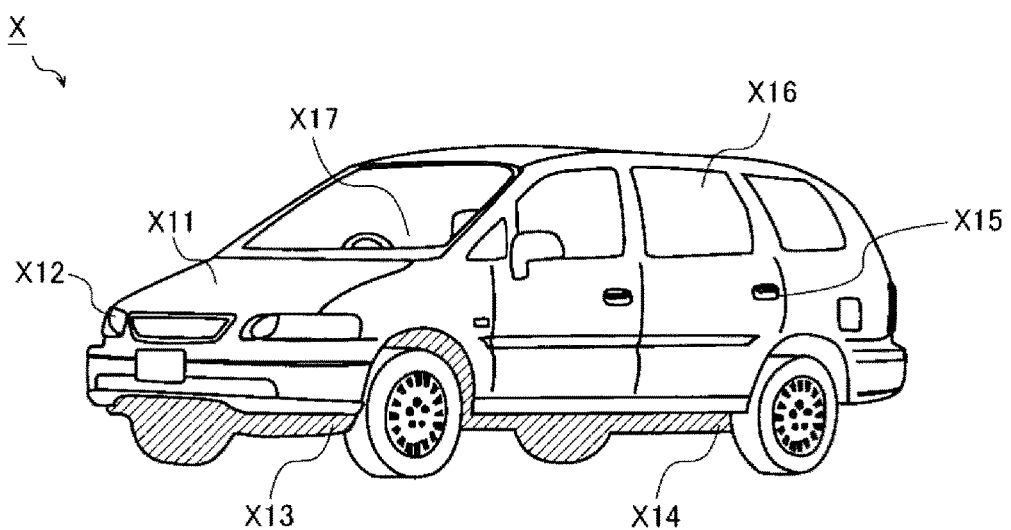
FIG. 7 is an appearance diagram illustrating one configuration example of a vehicle.

FIG. 7 is an appearance diagram illustrating one configuration example of a vehicle. A vehicle X illustrated in FIG. 7 is equipped with a battery (not illustrated) and various pieces of electronic equipment X11 to X18 that receive power provision from the battery to operate. The mounting positions of the pieces of electronic equipment X11 to X18 in this diagram are different from the actual ones in some cases for convenience of diagrammatic representation.

The electronic equipment X11 is an engine control unit that carries out control relating to an engine (injection control, electronic throttle control, idling control, oxygen sensor heater control, auto cruise control, and so forth).

The electronic equipment X12 is a lamp control unit that carries out lighting-on/off control of a high intensity discharge (HID) lamp, a daytime running lamp (DRL), and so forth.

The electronic equipment X13 is a transmission control unit that carries out control relating to transmission.

The electronic equipment X14 is a body control unit that carries out control relating to motion of the vehicle X (anti-lock brake system (ABS) control, electronic power steering (EPS) control, electronic suspension control, and so forth).

The electronic equipment X15 is a security control unit that carries out driving control of a door lock, a security alarm, and so forth.

The electronic equipment X16 represents pieces of electronic equipment incorporated in the vehicle X at the stage of factory shipment as pieces of standard equipment and manufacturer optional extras, such as a wiper, an electric door mirror, a power window, a damper (shock absorber), an electric sunroof, and an electric seat.

The electronic equipment X17 represents pieces of electronic equipment optionally mounted in the vehicle X as user optional extras, such as in-vehicle audio/visual (A/V) equipment, a car navigation system, and an electronic toll collection (ETC) system.

The electronic equipment X18 represents pieces of electronic equipment having a high breakdown voltage motor, such as an in-vehicle blower, an oil pump, a water pump, and a battery cooling fan.

The above-described switch device 100 and solenoid 3 can be incorporated in any of the pieces of electronic equipment X11 to X18.

Besides the above-described embodiment, various changes can be made on the configuration of the present disclosure without departing from the gist of the disclosure. It should be understood that the above-described embodiment is exemplification in all points and is not restrictive. Further, it should be understood that the technical range of the present disclosure is indicated by not the explanation of the above-described embodiment but the scope of claims and that all changes that belong to meanings and a range equivalent to the scope of claims are included therein.

For example, the switch device is the low-side switch IC for in-vehicle use in the above-described embodiment. However, the switch device does not need to be for in-vehicle use. Further, the switch device may be a high-side switch that causes conduction/interruption between an application end of a supply voltage and a load, instead of being the low-side switch that causes conduction/interruption between the ground potential and a load.

The switch device (100) described above has the following configuration (first configuration). The switch device includes a first terminal (OUT), a second terminal (GND), a third terminal (IN), a switch element (SW1) disposed between the first terminal and the second terminal, a control line (LN1) that reaches a control end of the switch element from the third terminal, a first circuit block (B1) that is disposed on the control line and is configured to drive the switch element according to a control signal supplied to the third terminal, at least one second circuit block (B2_1 to B2_4), each second circuit block being connected to a corresponding one of branch power supply lines (LN2_1 to LN2_4) that branch from the control line, a first resistor (R1) disposed between the third terminal and the first circuit block, and at least one second resistor (R2_1 to R2_4), each second resistor being disposed on a corresponding one of the branch power supply lines. The first circuit block and the at least one second circuit block each include at least one P-channel MOSFET, and the branch power supply lines branch from the control line between the third terminal and the first resistor.

In the switch device with the above-described first configuration, the first resistor and the at least one second resistor are disposed. Therefore, by properly setting each of the resistance values of the first resistor and the at least one second resistor, the occurrence of a latch-up when the inductive load connected to the switch device is disconnected can be suppressed while driving at the time of voltage reduction is ensured in each of the first circuit block and the at least one second circuit block. As a result, also in the whole of the switch device, the occurrence of a latch-up when the inductive load connected to the switch device is disconnected can be suppressed while driving at the time of voltage reduction is ensured.

The switch device with the above-described first configuration may have a configuration in which the second circuit block is a status monitoring circuit configured to monitor a status of the switch device (second configuration).

The switch device with the above-described second configuration can suppress the occurrence of a latch-up of the status monitoring circuit and therefore enhance the reliability of the switch device.

The switch device with the above-described first or second configuration may have a configuration in which each of resistance values of the first resistor and the second resistor is a resistance value based on a total area of a P-type well that is disposed in the at least one P-channel MOSFET of a corresponding one of the first circuit block and the at least one second circuit block (third configuration).

The switch device with the above-described third configuration can prevent each of the resistance values of the first resistor and the second resistor from becoming unnecessarily large.

The switch device with the above-described third configuration may have a configuration in which the resistance value is larger as the total area is larger (fourth configuration).

The switch device with the above-described fourth configuration can more surely prevent each of the resistance values of the first resistor and the second resistor from becoming unnecessarily large.

The switch device with any of the above-described first to fourth configurations may have a configuration in which a parasitic NPN transistor is formed between a back gate of the P-channel MOSFET and the first terminal (fifth configuration).

The switch device with any of the above-described first to fifth configurations may have a configuration in which a parasitic PNP transistor is formed between a source of the P-channel MOSFET and the second terminal (sixth configuration).

The switch device with any of the above-described first to sixth configurations may have a configuration in which the first circuit block is disposed adjacent to the first resistor (seventh configuration).

The switch device with the above-described seventh configuration can suppress routing of the control line.

The switch device with any of the above-described first to seventh configurations may have a configuration in which each of the at least one second circuit block is disposed adjacent to a corresponding one of the at least one second resistor (eighth configuration).

The switch device with the above-described eighth configuration can suppress routing of the branch power supply lines.

The switch device with the above-described eighth configuration may have a configuration in which the first circuit block, the at least one second circuit block, and the switch element line up along a first direction, in which the first circuit block and the first resistor line up along a second direction orthogonal to the first direction, and in which each of the at least one second circuit block and the corresponding one of the at least one second resistor line up along the second direction (ninth configuration).

The switch device with the above-described ninth configuration can suppress the occurrence of the situation in which the switch device becomes excessively long in only either the first direction or the second direction.

The electronic equipment (X11 to X18) described above has a configuration including the switch device with any of the above-described first to ninth configurations and the inductive load (3) connected to the switch device (tenth configuration).

The electronic equipment with the above-described tenth configuration can suppress the occurrence of a latch-up when the inductive load is disconnected while ensuring driving at the time of voltage reduction in the switch device disposed in the electronic equipment.

The vehicle (X) described above has a configuration including the electronic equipment with the above-described tenth configuration (eleventh configuration).

The vehicle with the above-described eleventh configuration can suppress the occurrence of a latch-up when the inductive load is disconnected while ensuring driving at the time of voltage reduction in the switch device disposed in the vehicle.

What is claimed is:
1. A switch device, comprising:
a first terminal;
a second terminal;
a third terminal;
a switch element disposed between the first terminal and the second terminal;
a control line that reaches a control end of the switch element from the third terminal;
a first circuit block that is disposed on the control line and is configured to drive the switch element according to a control signal supplied to the third terminal;
at least one second circuit block, wherein
each of the at least one second circuit block is connected to a corresponding one of branch power supply lines that branch from the control line, and
the at least one second circuit block is a status monitoring circuit configured to monitor a status of the switch device;
a first resistor disposed between the third terminal and the first circuit block; and
at least one second resistor, wherein
each of the at least one second resistor is disposed on the corresponding one of the branch power supply lines,
the first circuit block and the at least one second circuit block include at least one P-channel metal oxide semiconductor field effect transistor, and the branch power supply lines branch from the control line between the third terminal and the first resistor.

2. The switch device according to claim 1, wherein a resistance value of each of the first resistor and the at least one second resistor is based on a total area of a P-type well that is disposed in the at least one P-channel metal oxide semiconductor field effect transistor of a corresponding one of the first circuit block and the at least one second circuit block.

3. The switch device according to claim 2, wherein the resistance value is larger as the total area is larger.

4. The switch device according to claim 1, wherein a parasitic NPN transistor is formed between a back gate of the at least one P-channel metal oxide semiconductor field effect transistor and the first terminal.

5. The switch device according to claim 1, wherein a parasitic PNP transistor is formed between a source of the at least one P-channel metal oxide semiconductor field effect transistor and the second terminal.

6. The switch device according to claim 1, wherein the first circuit block is disposed adjacent to the first resistor.

7. The switch device according to claim 1, wherein each of the at least one second circuit block is disposed adjacent to a corresponding one of the at least one second resistor.

8. The switch device according to claim 7, wherein
the first circuit block, the at least one second circuit block, and the switch element line up along a first direction,
the first circuit block and the first resistor line up along a second direction orthogonal to the first direction, and
each of the at least one second circuit block and the corresponding one of the at least one second resistor line up along the second direction.

9. Electronic equipment, comprising:
the switch device according to claim 1; and
an inductive load connected to the switch device.

10. A vehicle, comprising: the electronic equipment according to claim 9.

11. A switch device, comprising:
a first terminal;
a second terminal;
a third terminal;
a switch element disposed between the first terminal and the second terminal;
a control line that reaches a control end of the switch element from the third terminal;
a first circuit block that is disposed on the control line and is configured to drive the switch element according to a control signal supplied to the third terminal;
at least one second circuit block, wherein
each of the at least one second circuit block is connected to a corresponding one of branch power supply lines that branch from the control line;
a first resistor disposed between the third terminal and the first circuit block; and
at least one second resistor, wherein
each of the at least one second resistor is disposed on the corresponding one of the branch power supply lines,
the first circuit block and the at least one second circuit block include at least one P-channel metal oxide semiconductor field effect transistor,
a resistance value of each of the first resistor and the at least one second resistor is based on a total area of a P-type well that is disposed in the at least one P-channel metal oxide semiconductor field effect transistor of a corresponding one of the first circuit block and the at least one second circuit block, and
the branch power supply lines branch from the control line between the third terminal and the first resistor.

12. A switch device, comprising:
a first terminal;
a second terminal;
a third terminal;
a switch element disposed between the first terminal and the second terminal;
a control line that reaches a control end of the switch element from the third terminal;
a first circuit block that is disposed on the control line and is configured to drive the switch element according to a control signal supplied to the third terminal;
at least one second circuit block, wherein
each of the at least one second circuit block is connected to a corresponding one of branch power supply lines that branch from the control line;
a first resistor disposed between the third terminal and the first circuit block; and
at least one second resistor, wherein
each of the at least one second resistor is disposed on the corresponding one of the branch power supply lines,
each of the at least one second circuit block is disposed adjacent to a corresponding one of the at least one second resistor,
the first circuit block, the at least one second circuit block, and the switch element line up along a first direction,
the first circuit block and the first resistor line up along a second direction orthogonal to the first direction,
each of the at least one second circuit block and the corresponding one of the at least one second resistor line up along the second direction,
the first circuit block and the at least one second circuit block include at least one P-channel metal oxide semiconductor field effect transistor, and
the branch power supply lines branch from the control line between the third terminal and the first resistor.

* * * * *